United States Patent
Colt, Jr.

(10) Patent No.: US 6,383,892 B1
(45) Date of Patent: May 7, 2002

(54) DOUBLE SILICON-ON-INSULATOR DEVICE AND METHOD THEREOF

(75) Inventor: John Z. Colt, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,315

(22) Filed: Jan. 5, 1999

Related U.S. Application Data (62) Division of application No. 09/130,299, filed on Aug. 6, 1998.

(51) Int. Cl.⁷ .............................................. H01L 21/30
(52) U.S. Cl. ...................................... 438/457; 257/208
(58) Field of Search ........................ 438/69, 231, 457; 428/422; 257/347, 208

(56) References Cited

U.S. PATENT DOCUMENTS

| | | |
|---|---|---|
| 3,622,382 A | 11/1971 | Brack et al. |
| 4,412,868 A | 11/1983 | Brown et al. |
| 4,596,070 A | 6/1986 | Bayraktaroglu |
| 4,601,760 A | 7/1986 | Hemmah et al. |
| 4,997,786 A | 3/1991 | Kubota et al. |
| 5,083,190 A | 1/1992 | Pfiester |
| 5,164,805 A | 11/1992 | Lee |
| 5,273,921 A | 12/1993 | Neudeck et al. |
| 5,349,228 A | 9/1994 | Neudeck et al. |
| 5,382,818 A | 1/1995 | Pein |
| 5,420,048 A | 5/1995 | Kondo |
| 5,422,305 A | 6/1995 | Seabaugh et al. |
| 5,461,250 A | 10/1995 | Burghartz et al. |
| 5,494,846 A | 2/1996 | Yamazake |
| 5,536,966 A | 7/1996 | Robinson et al. |
| 5,548,149 A | 8/1996 | Joyner |
| 5,689,127 A | 11/1997 | Chu et al. |
| 5,801,084 A * | 9/1998 | Beasom ....................... 438/457 |
| 5,808,330 A * | 9/1998 | Rostoker ..................... 257/208 |

FOREIGN PATENT DOCUMENTS

| | | |
|---|---|---|
| JP | 8-148556 | 6/1996 |
| JP | 8-148567 | 6/1996 |
| JP | 9-45765 | 2/1997 |
| JP | 9-129885 | 5/1997 |
| JP | 9-232424 | 9/1997 |

OTHER PUBLICATIONS

R. F. Brom et al., "Vertical Schottky Diode–Memory Device", IBM Technical Bulletin, vol. 15. No. 7, Dec. 1972.

* cited by examiner

*Primary Examiner*—John F. Niebling
*Assistant Examiner*—Andre C Stevenson
(74) *Attorney, Agent, or Firm*—McGuireWoods LLP; Mark Chardurjian (57) ABSTRACT

An integrated circuit chip wherein one or more semiconductor devices are completely isolated from bulk effects of other semiconductor devices in the same circuit and a method of making the integrated circuit chip. The devices may be passive devices such as resistors, or active devices such as diodes, bipolar transistors or field effect transistors (FETs). A multi-layer semiconductor body is formed of, preferably silicon and silicon dioxide. A conducting region or channel is formed in one or more of the layers. For the FET, silicon above and below the channel region provides controllable gates with vertically symmetrical device characteristics. Buried insulator layers may be added to isolate the lower gate of individual devices from each other and to create multiple vertically stacked isolated devices. Both PFET and NFET devices can be made with independent doping profiles in both depletion and accumulation modes.

26 Claims, 10 Drawing Sheets

DOUBLE SILICON-ON-INSULATOR DEVICE AND METHOD THEREOF

This is a divisional application of co-pending U.S. application Ser. No. 09/130,299 filed on Aug. 6, 1998.

BACKGROUND OF THE INVENTION

1. Field of the Invention

The present invention generally relates to semiconductor devices and more particularly to silicon junction devices formed in silicon on insulator (SOI) technology.

2. Background Description

Typical prior art bulk silicon such as diodes, field effect transistors (FETs) and bipolar transistors formed on a silicon wafer are subject to parasitic effects resulting from other bulk devices in close proximity and from vertical structural asymmetry. These parasitic effects include voltage limitations and cross-device interference.

Consequently, typical bulk semiconductor processes, especially FET processes that include both p-type FETs (PFETs) and n-type FETS (NFETs) and commonly referred to as CMOS, require dedicated structures to localize and reduce parasitic effects. These specialized structures include providing surface diffusions referred to as guard rings, individual doped wells (N-wells and/or P-wells) and including a buried insulator.

Discrete devices, i.e., individually formed and packaged transistors or diodes, are normally free from these parasitic effects. One example of such discrete device is a discrete JFET. A discrete JFET may be formed in a doped silicon bar by forming contacts at opposite ends of the bar and a diffusion ring of an opposite dopant type therebetween. However, these discrete devices have limited applications and do not have any of the advantages of monolithic circuit integration.

Thus, there is a need for individually isolated semiconductor devices that may be integrated into a single circuit on a single chip.

SUMMARY OF THE INVENTION

It is therefore a purpose of the present invention to improve silicon device isolation.

It is another purpose of the present invention to improve integrated circuit device isolation.

It is yet another purpose of the present invention to improve integrated circuit device isolation without impairing device density.

The present invention is an integrated circuit chip wherein one or more semiconductor devices are completely isolated from bulk effects of other semiconductor devices in the same circuit and a method of making the integrated circuit chip. The devices may be passive devices such as resistors or active devices such as diodes, bipolar transistors or field effect transistors (FETs). A multi-layer semiconductor body is formed of, preferably silicon and silicon dioxide. A conducting region or channel is formed in one or more of the layers. For the FET, silicon above and below the channel region provide controllable gates with vertically symmetrical device characteristics. Buried insulator layers may be added to isolate the lower gate of individual devices from each other and to facilitate creating multiple vertically stacked isolated devices.

Both PFET and NFET devices can be made with independent doping profiles in both depletion and accumulation styles.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
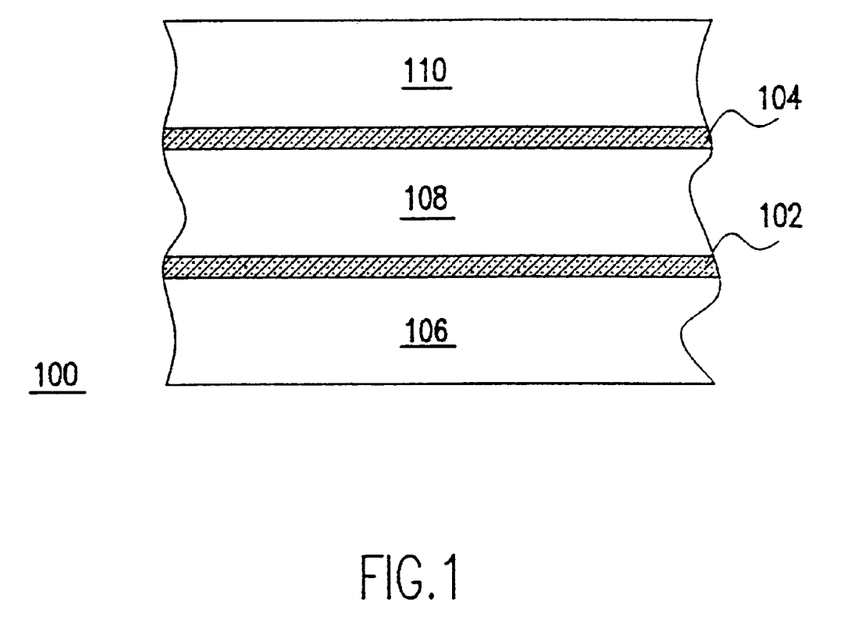
FIG. 1 is cross-sectional view of a preferred embodiment multi-layered semiconductor structure.

Referring now to the drawings, and more particularly to FIG. 1, the preferred embodiment structure is formed in a semiconductor wafer 100, preferably silicon, by implanting oxygen, which during a subsequent anneal reacts with the silicon to form buried oxide ($SiO_2$) layers 102, 104. Thus, individual silicon layers 106, 108 and 110 are formed and isolated from each other by oxide layers 102, 104.

Although the structure of FIG. 1 is shown as including two buried oxide layers 102, 104 defining three individual silicon layers, any number of buried layers 102, 104 may be formed using multiple oxygen implants to formed a multi-layered structure, i.e., implanting n oxygen layers to define n+1 silicon layers, where n is a positive integer.

Further, although the preferred method of forming the multi-layer structure 100 of FIG. 1 is by implanting oxygen into silicon, the multi-layer structure 100 may be formed by any appropriate manner. So, for example, a single insulator ($SiO_2$) layer may be formed on a surface of two or more silicon wafers. Then, these oxidized wafers may bonded together, sandwiching a layer of oxide 102 between two thick silicon layers 106, 108. One silicon layer 108 is ground to a desired thickness and the ground surface (not shown) is oxidized. A third oxidized wafer is bonded to the newly formed oxide, forming a second oxide layer 104. The silicon layer 110 on third oxide layer 104 is ground to a desired thickness to form multi-layer wafer 100 of FIG. 1.

Figure 2A:
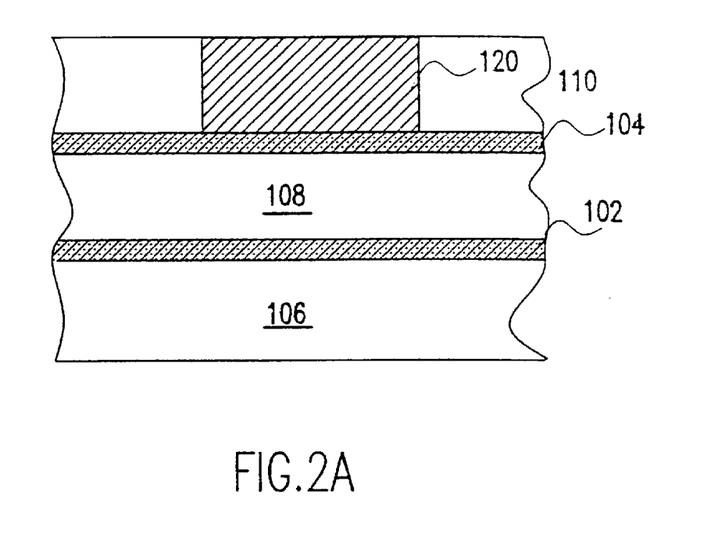
FIGS. 2A–B show a preferred embodiment diode formed in the layered structure of FIG. 1.
Figure 2B:
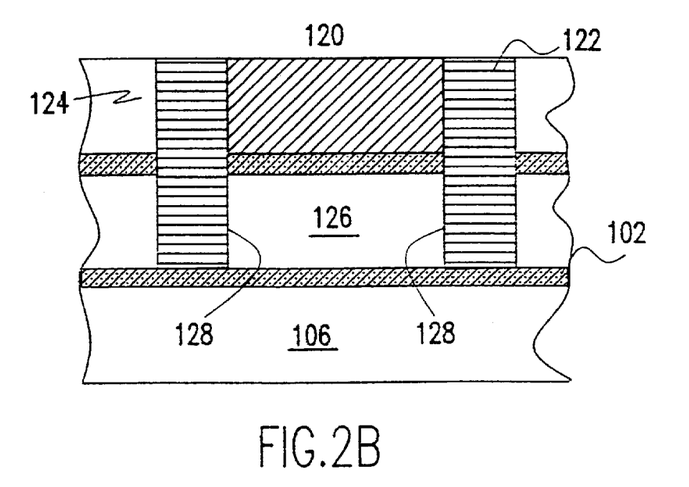

Having prepared the layered structure 100, a preferred embodiment diode may be formed on the wafer 100 as shown in FIGS. 2A–B. Thus, in FIG. 2A, a shallow trench 120 is opened in surface silicon layer 110 down to buried oxide layer 104. Preferably, buried oxide layer 104 acts as an etch stop during trench 120 etch. Next, the trench 120 is filled with oxide and the oxide is planarized.

Then, in FIG. 2B deep trenches 122 and 124 are formed at either end of shallow trench 120. Deep trenches 122 and 124 extend down through buried oxide layer 104 and buried silicon layer 108 to second buried oxide layer 102, isolating section 126. Preferably, buried layer 108 is lightly doped either P-type or N-type. A multi-step etch is used to etch deep trenches 122 and 124, each buried oxide layer 104 and 102 acting as an etch stop to etching silicon layers 110 and 108, respectively.

A diode junction is formed in the section 126 between deep trenches 122 and 124, which are filled with conducting material. In one preferred embodiment, one deep trench 122 is filled with heavily doped polysilicon, doped with the same dopant type as isolated section 126, e.g. P-type. Then, the other trench 124 is filled with heavily doped polysilicon, doped with the other dopant type, N-type in this example. The wafer is heated sufficiently that dopant from the doped polysilicon in the deep trenches out-diffuses into isolated section 126, forming the diode junction there.

In a second preferred embodiment, after opening deep trenches 122 and 124, sidewalls 128 of section 126 are exposed and are selectively doped with opposite dopant types. The dopants are diffused into the section 126 to form the diode. Then, the deep trenches 122, 124 are filled with metal. Optionally to avoid forming a Schottkey barrier diode, the sidewall 128 doping may be to a level sufficient to form an ohmic contact.

In a variation on this preferred embodiment, a resistor may be formed, instead of a diode, by filling both deep trenches 122, 124 with heavily doped polysilicon, doped with the same dopant type as section 126. Alternately, in this embodiment, both sidewalls 128 may be heavily doped with the same dopant type as section 126 and, the trenches 122, 124 filled with metal.

Optionally, additional deep trenches (not shown) may be formed outboard of the preferred embodiment device and filled with insulator to completely isolate the preferred embodiment device from other devices on the same chip or, even, from other devices in the same circuit.

Figure 3A:
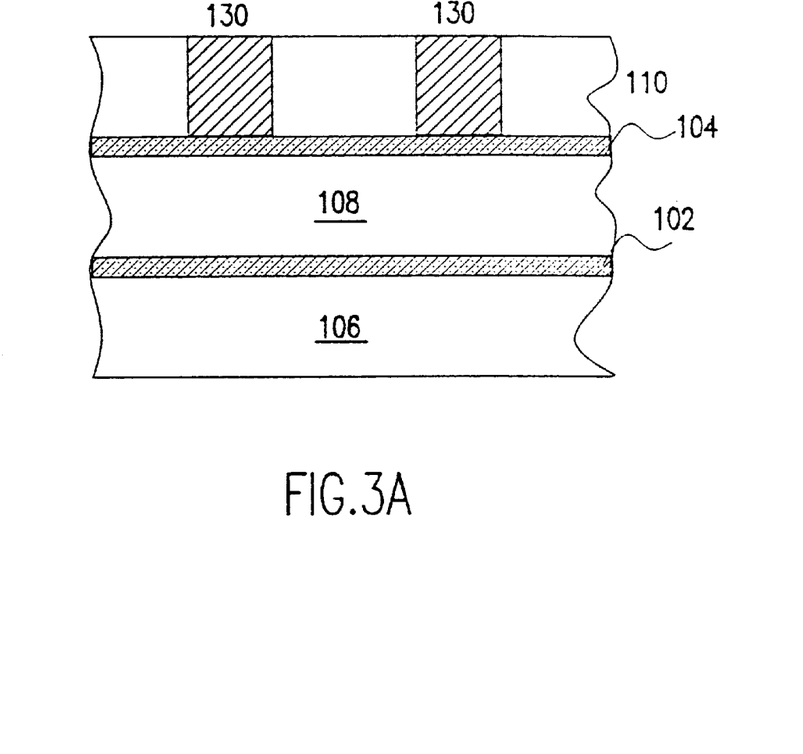
FIGS. 3A–B show a preferred embodiment bipolar transistor formed in the layered structure of FIG. 1.
Figure 3B:
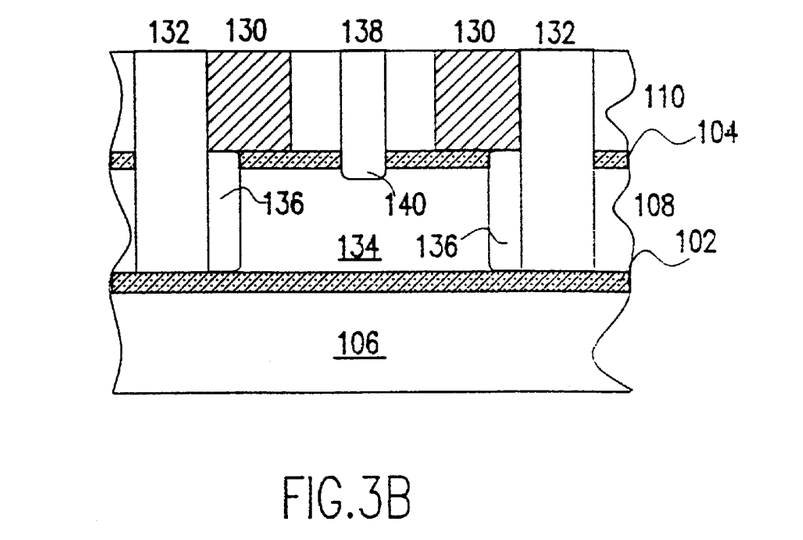

A preferred embodiment bipolar transistor is formed in the layered wafer 100 in FIGS. 3A–B. In this preferred embodiment, as shown in FIG. 3A, a pair of shallow trenches 130 are opened in surface silicon layer 110 down to buried oxide layer 104. Again, it is preferred that buried oxide layer 104 acts as an etch stop during shallow trench 130 etch. Next, the shallow trenches 130 are filled with oxide and the oxide is planarized.

Then, in FIG. 3B deep trenches 132 are formed outboard of shallow trenches 130. Deep trenches 132 are emitter and collector openings for the preferred embodiment lateral bipolar transistor. As with the preferred embodiment diode of FIGS. 2A–B, deep trenches 132 extend down through buried oxide layer 104 and buried silicon layer 108 to second buried oxide layer 102, isolating section 134. As with the preferred embodiment diode, buried layer 108 is, preferably, lightly doped either p-type or n-type, depending on the intended bipolar transistor type, i.e., whether pnp or npn. A multi-step etch is used to etch deep trenches 132, each buried oxide layer 104 and 102 acting as an etch stop to etching silicon layers 110 and 108, respectively.

Emitter and collector regions 136 may be formed identically to forming the diode junction of the above preferred embodiment, except that both are formed of the same type dopant and simultaneously. Thus, if section 134 is P-type, then both emitter and collector regions 136 are N-type and vice versa. Also, the emitter and collector regions 136 may be formed by filling the deep trenches 132 with heavily doped polysilicon, which outdiffuses to form diffusion regions 136; or, regions 136 may be formed by sidewall doping with the deep trenches filled with metal.

Finally, a shallow trench 138 is opened between trenches 132 though surface silicon layer 110 down through buried oxide layer 104 to base section 134. A base contact 140 is formed in base section 134 and the shallow trench 138 is filled with conducting material. The ohmic base contact region 140 may be formed by filling the shallow trench 138 with heavily doped polysilicon, doped with the same dopant type as section 134 or, alternately, by implanting the same dopant type into base region 140 and, then, filling the shallow trench 138 with metal.

As with the preferred embodiment diode, additional deep trenches may be included to further isolate the preferred embodiment bipolar transistor from surrounding structures and devices.

Figure 4A:
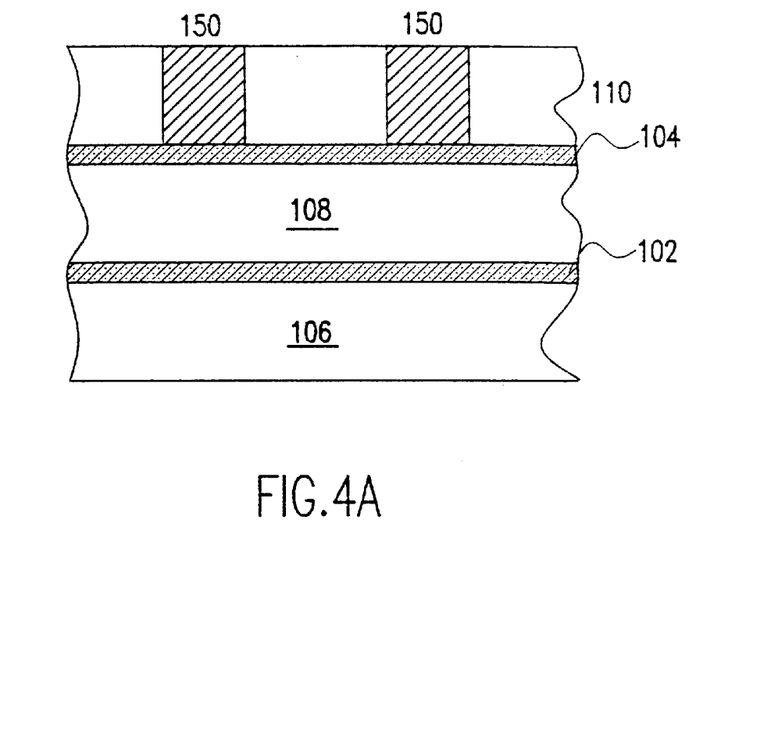
FIGS. 4A–B show a preferred embodiment FET formed in the layered structure 100 of FIG. 1.
Figure 4B:
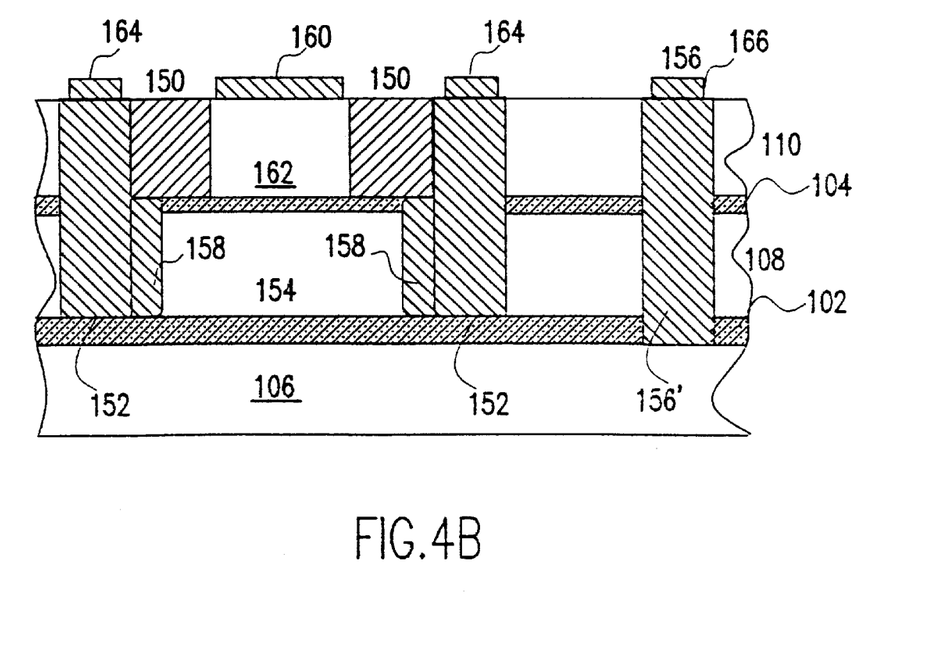

In FIGS. 4A–B, a preferred embodiment FET is formed in the layered structure 100 of FIG. 1. In the preferred embodiment FET of FIG. 4A, a pair of shallow trenches 150 are opened in surface silicon layer 110 down to buried oxide layer 104. Again, it is preferred that buried oxide layer 104 acts as an etch stop during shallow trench 150 etch. Next, the shallow trenches 150 are filled with oxide and the oxide is planarized.

Then, in FIG. 4B deep trenches 152 are formed outboard of shallow trenches 150. Deep trenches 152 are source and drain openings for the preferred embodiment FETs. Deep trenches 152 extend down through buried oxide layer 104 and buried silicon layer 108 to second buried oxide layer 102, isolating channel section 154. Depending on the type of FETs desired, buried layer 108 is, preferably, lightly doped either p-type or n-type. A multi-step etch is used to etch deep trenches 152, each buried oxide layer 104 and 102 acting as an etch stop to etching silicon layers 110 and 108, respectively.

Lower gate contact deep trenches 156 are formed simultaneously with deep trenches 152. Lower gate contact trenches 156 are etched through second buried layer 102 to lower silicon layer 106. Optionally, lower gate contact trenches 156 may be etched into lower silicon layer 106 or, through lower silicon layer 106.

Next, source/drain diffusions 158 are formed at opposite ends of channel section 154. Source/drain diffusions 158 may be formed identically to forming emitter and collector regions 136 of the above preferred bipolar transistor embodiment. Thus, if channel section 154 is p-type, then both source and drain diffusions 158 are n-type and vice versa. Also, the source and drain diffusions 158 may be formed by filling the deep trenches 152 with heavily doped polysilicon, which outdiffuses forming diffusions 158; or, they may be formed by sidewall doping and diffusing the dopant into the ends of the channel section 154 in the deep trenches 152, which are then filled with metal.

As source/drain diffusions 158 are formed, a lower gate contact 156' is formed to lower silicon layer 106 through deep trenches 156. Lower gate layer 106 is doped to a much higher dopant concentration than channel section 154 such that the gate is a conductor. The lower gate layer 106 may be doped with any dopant type, provided it is doped to be sufficiently conductive. This lower gate contact 156' may be formed by filling the deep trenches 156 with heavily doped polysilicon, which forms an ohmic contact to lower silicon layer 106; or, alternately, by heavily doping exposed surfaces of lower silicon layer 106 and then, filling the deep trenches 154 with metal.

Coincident with or, after forming the lower gate contacts 156', upper gate contacts 160 are formed to upper gate segments 162. A portion of upper gate segment 162 may be heavily doped to form an ohmic contact. Then, metal wiring or contact studs are formed on the four device terminals: source/drain contacts 164, lower gate contact 166 and upper gate contact 160.

Thus, the preferred embodiment FET has a gate both above 162 and below 106 its channel. This pair of gates for preferred embodiment FETs eliminates the vertical structural asymmetry of prior art devices.

Figure 5A:
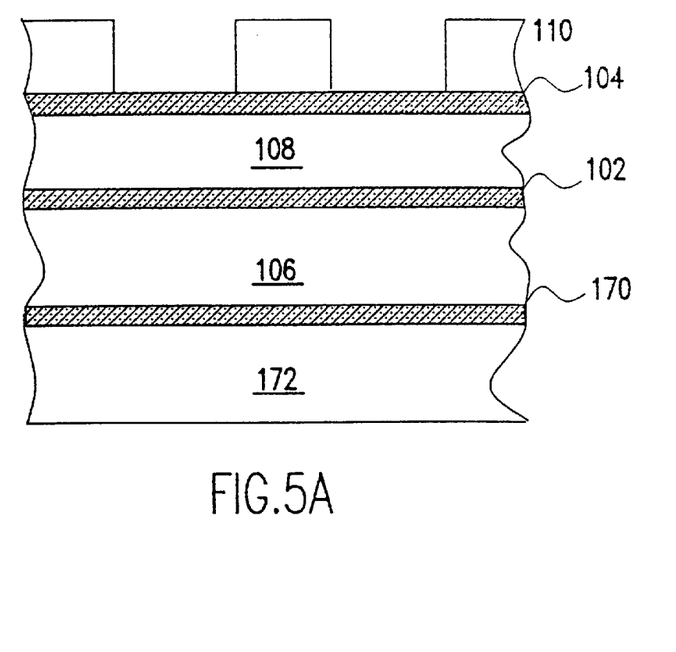
FIGS. 5A–E show a first alternate embodiment method of forming the preferred embodiment FET, which includes at least one additional buried oxide layer and at least one additional silicon layer.
Figure 5B:
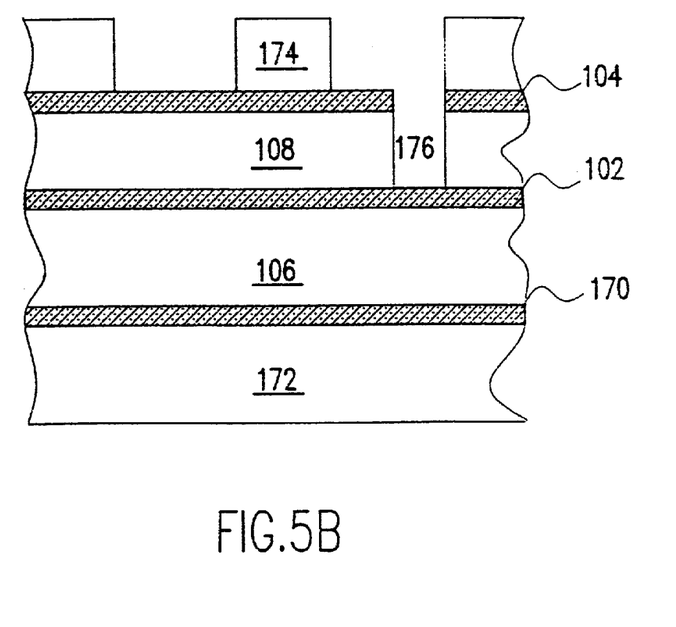
Figure 5C:
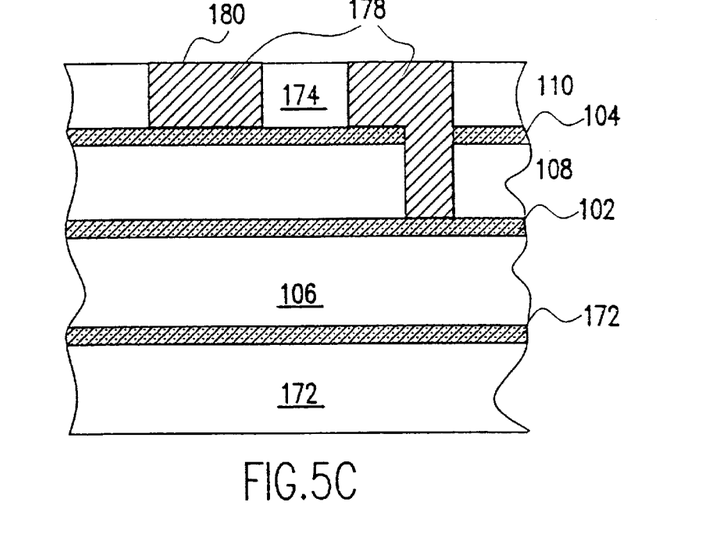

FIGS. 5A–E show a first alternate embodiment method of forming the preferred embodiment FET, which includes at least one additional buried oxide layer 170 and, as a result, at least one additional silicon layer 172. In this first alternate embodiment method, in FIG. 5A the surface layer 110 is selectively removed to define the upper gate 174. The upper oxide layer 104 acts as an etch stop. Then, in FIG. 5B, the lower gate contact trench 176 is partially etched, selectively, through upper oxide layer 104 and channel layer 108 to lower oxide layer 102. In FIG. 5C the opened trenches are filled with oxide 178 and the surface 180 is planarized.

Figure 5D:
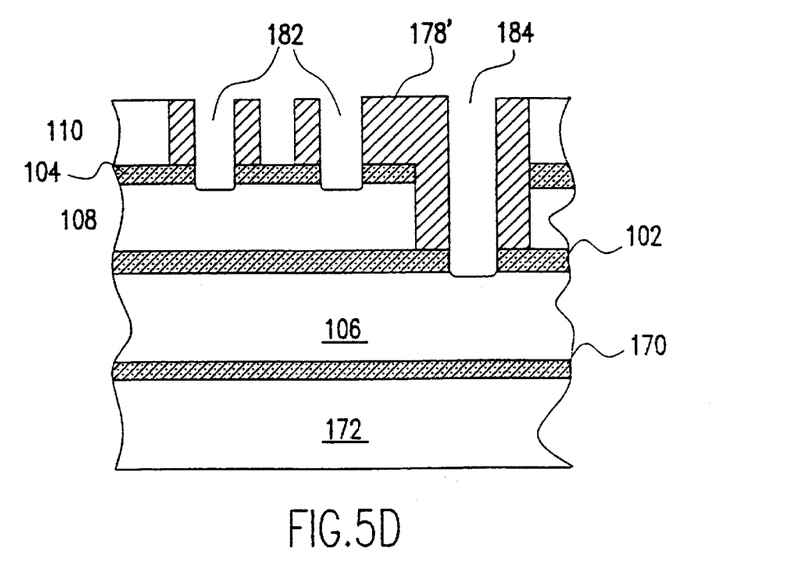

Next, in FIG. 5D, the oxide fill 178 is patterned and directionally etched, selective to silicon, until trenches 182 are opened. Trenches 182 extend through the fill oxide 178 to channel layer 108 in source/drain regions. A lower gate contact trench 184 to lower gate layer 106 is opened coincident with opening trenches 182. An oxide spacer 178' remains between the lower gate contact trench 184 and source/drain trenches 182, while oxide lines each trench 182, 184. Having exposed silicon layer 108 in source/drain regions through trenches 182 and lower gate layer 106 in lower gate contact trench 184, the exposed portions of the silicon layers 106, 108 are etched, directionally, down to the next lowest buried oxide layer 102, 172, respectively.

Figure 5E:
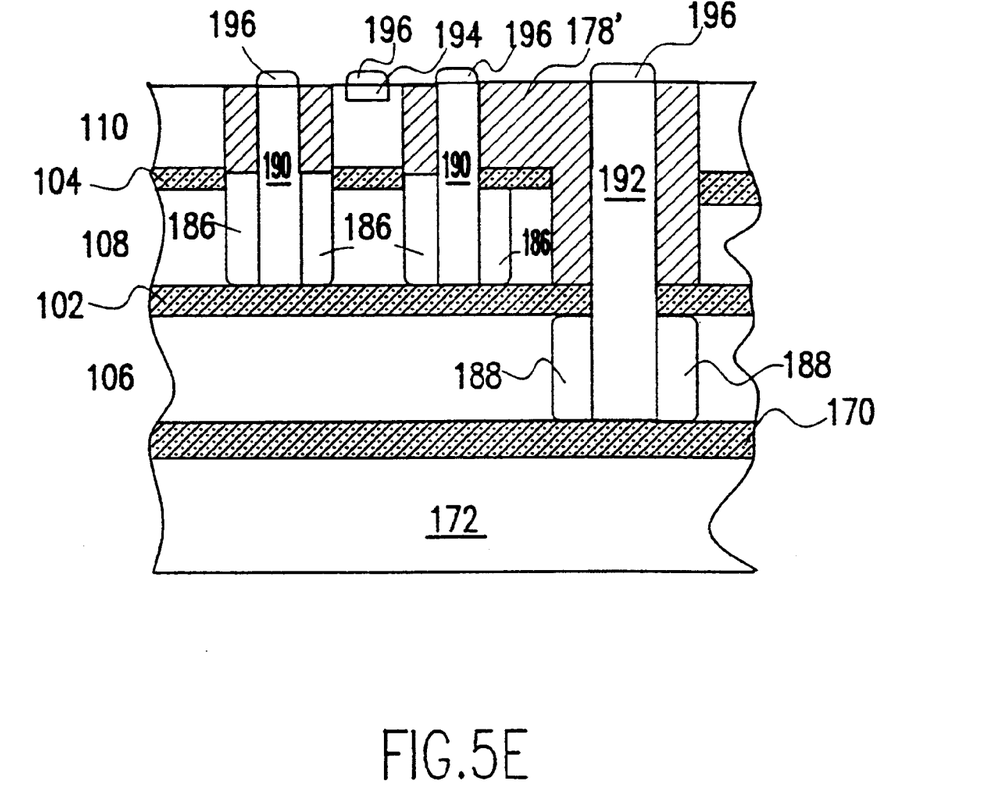

Finally, in FIG. 5E source/drain diffusions 186 and lower gate contact 188 are formed and, the trenches 182, 184 are filled with conducting material 190, 192, respectively. The source/drain diffusions 186 and lower gate contact 188 may be formed by filling the opened trenches 182, 184 with heavily doped polysilicon 190, 192, which forms diffusions 186 and an ohmic contact 188 through outdoping.

Alternately, exposed sidewalls of silicon layers 106, 108 are doped sufficiently such that source/drain diffusions 186 form during a subsequent anneal step. An ohmic contact 188 is formed and remains ohmic after the anneal step. This diffusion/contact formation is followed by filling the opened trenches 182, 184 with metal 190, 192. A top gate contact 194 may be formed coincidentally with ohmic contact 188, and is also intended to be an ohmic contact. Having filled the open trenches with conductive material 190, 192, such as heavily doped polysilicon or metal, conductive caps or, studs 196, preferably of metal are formed for subsequent connection.

Figure 6A:
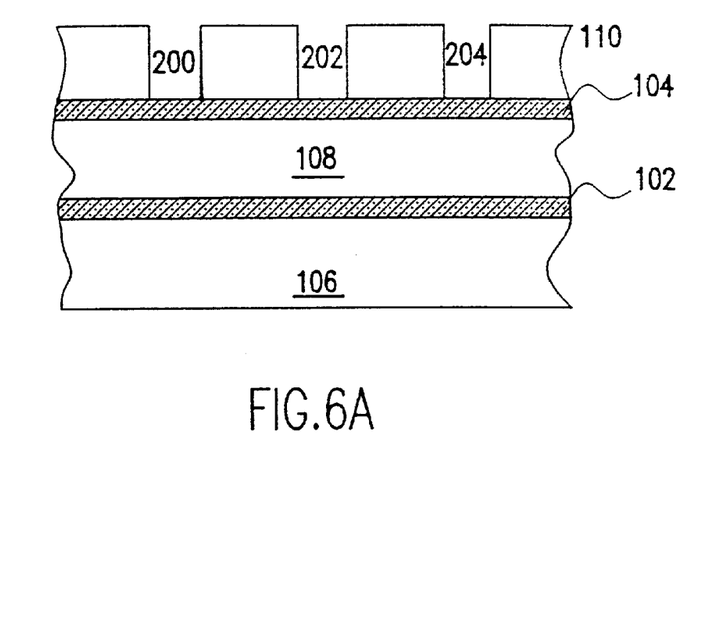
FIGS. 6A–E show a second alternate embodiment method of forming the preferred embodiment FET.
Figure 6B:
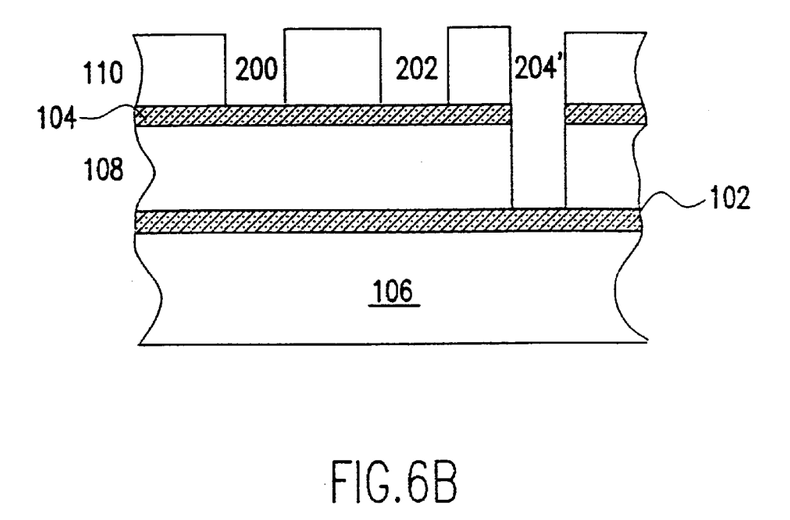
Figure 6C:
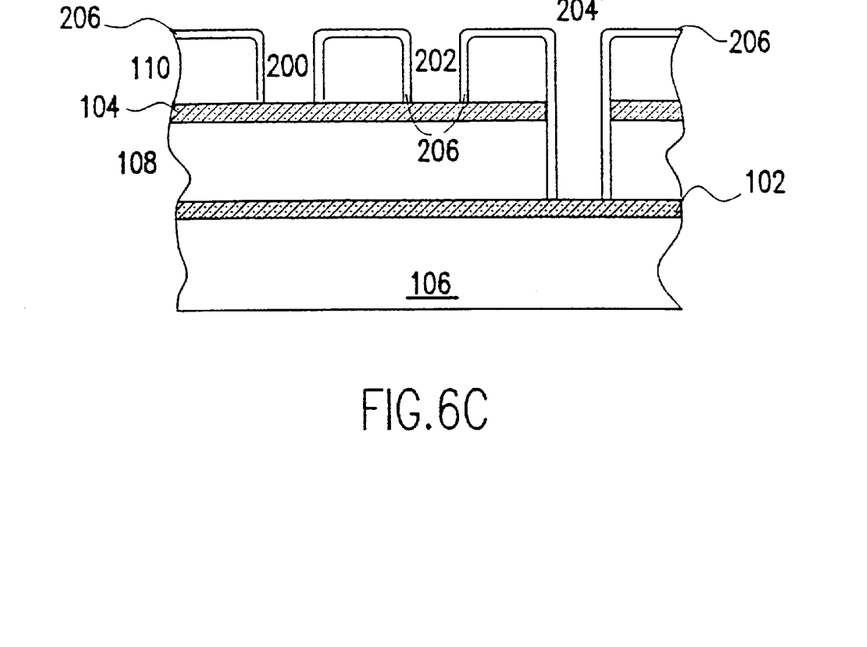

FIGS. 6A–E show a second alternate embodiment method of forming the preferred embodiment FET. First, in FIG. 6A, shallow trenches 200, 202 and 204 are etched through top silicon layer 110 to upper buried oxide layer 104. After selectively removing exposed buried oxide layer in shallow trench 204, silicon etching continues until second buried oxide layer 102 is reached, forming deep trench 204' in FIG. 6B. Then, a conformal oxide layer 206 in FIG. 6C is formed on the structure of FIG. 6B.

Figure 6D:
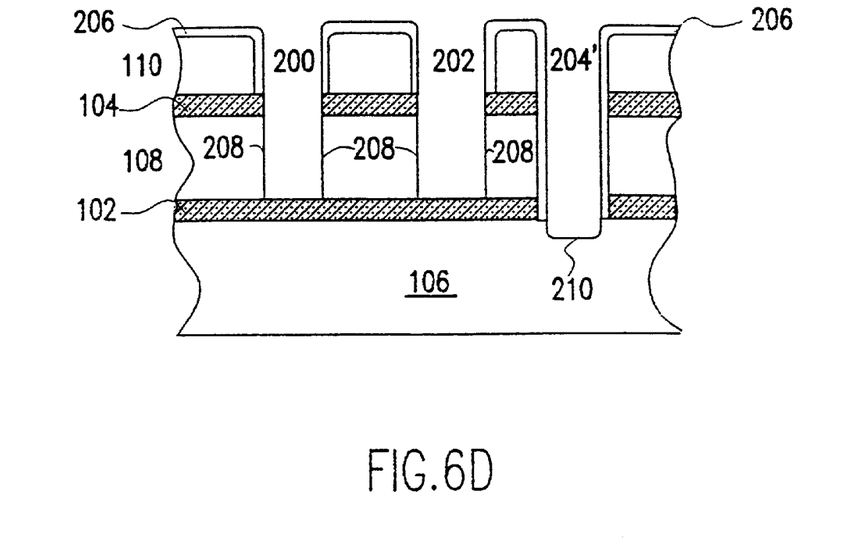

Next, in FIG. 6D, oxide is removed from the bottom of the trenches 200, 202 and 204', exposing silicon layers 108 and 106, respectively. The exposed portions of layer 108 are directionally etched until lower buried layer 102 is reached. At this point sidewalls 208 and lower gate contact area 210 have been exposed.

Figure 6E:
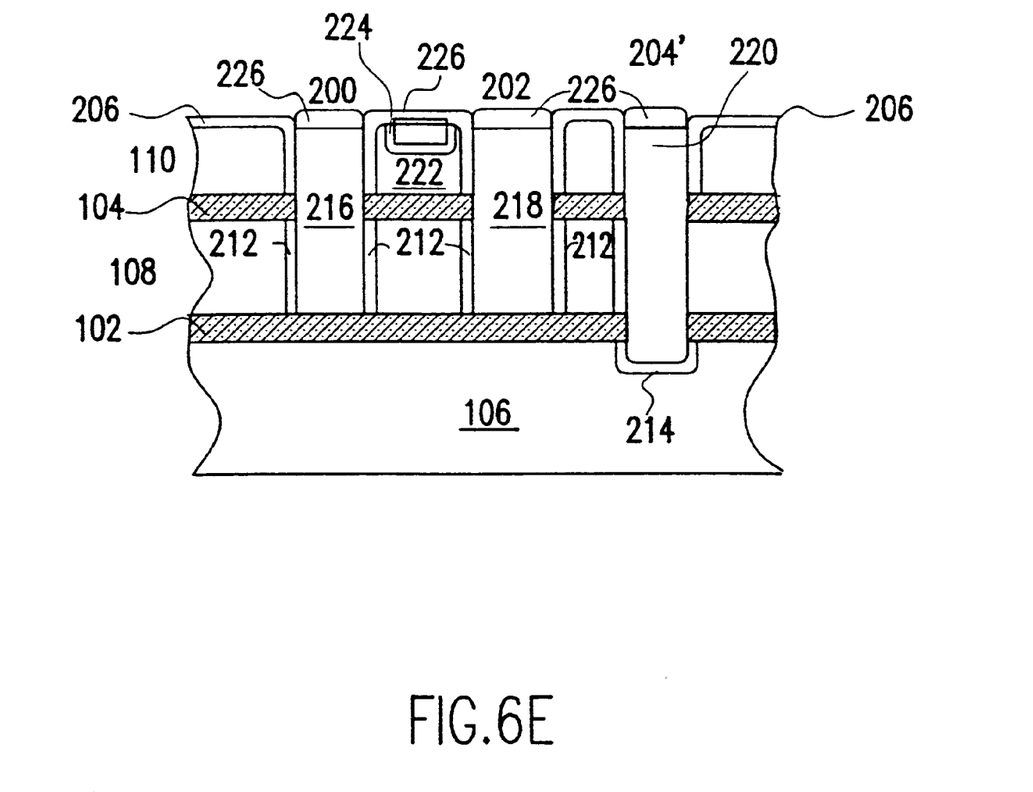

So, in FIG. 6E source/drain diffusions 212 and lower gate contact 214 are formed and, the trenches 200, 202 and 204' are filled with conducting material 216, 218 and 220, respectively. The source/drain diffusions 212 and lower gate contact 214 may be formed by filling the opened trenches 200, 202 and 204' with heavily doped polysilicon 216, 218 and 220, which forms diffusions 212 and an ohmic contact 214 through outdiffusion. Alternately, exposed sidewalls of silicon layer 106 are doped sufficiently such that source/drain diffusions 212 form during a subsequent anneal step. An ohmic contact 214 forms in lower gate layer 106 and remains ohmic after the anneal step. This is followed by filling the opened trenches 200, 202 and 204' with metal 216, 218 and 220.

A opening may be formed through to gate 222 and a top gate contact 224 may be formed coincidentally with ohmic contact 214. Top gate contact 224 is also intended to be an ohmic contact. Having formed the top gate contact 224 and filled trenches 200, 202 and 204' with conductive material 216, 218 and 220, such as heavily doped polysilicon or metal, conductive caps or studs 226, preferably of metal are formed for subsequent connection.

While the invention has been described in terms of preferred embodiments, those skilled in the art will recognize that the invention can be practiced with modification within the spirit and scope of the appended claims.

I claim:

1. A method of forming an FET comprising:
providing a substrate including at least first, second, and third layers of semiconductor material alternating with at least first and second dielectric layers;
forming a first gate of the FET including forming first openings in the first layer of semiconductor material;
disposing a dielectric in said first openings, the first layer of semiconductor material between the openings acting as said first gate;
forming diffusion regions of the FET including forming second openings, adjacent the first openings, through the first and second layers of semiconductor material and through the first dielectric layer; and
disposing conductive material in the second openings in electrical contact with the second layer of semiconductor material between said conductive material in the second openings.

2. The method of claim 1 further comprising the steps of:
forming contacts to a second gate of the FET including forming third openings through the first and second layers of semiconductor material and through the first and second dielectric layers; and
disposing conductive material in the third openings in electrical contact with the third layer of semiconductor material, the third layer of semiconductor material below the first gate acting as the second gate.

3. The method of claim 2 further comprising the steps of:
forming fourth openings through the first, second, and third layers of semiconductor material and through the first and second dielectric layers down to a third dielectric layer; and
disposing a dielectric in the fourth openings for isolating the FET from an adjacent FET.

4. The method of claim 2, wherein the semiconductor material is silicon and the conductive material disposed in the third openings is doped polysilicon.

5. The method of claim 1, wherein the semiconductor material is silicon and the step of providing the substrate comprises:
forming a $SiO_2$ layer on a plurality of silicon wafers; and
bonding three or more said wafers together, a multilayered wafer being formed having two buried $SiO_2$ layers.

6. The method of claim 5 wherein the bonding step comprises:

bonding an SiO$_2$ layer on a first silicon wafer to an SiO$_2$ layer on a second silicon wafer;

grinding a silicon surface of said second silicon wafer to a desired thickness;

oxidizing said ground surface;

bonding a third silicon wafer to said oxidized surface; and grinding a silicon surface of said third silicon wafer to a desired thickness.

7. The method of claim 1, wherein the semiconductor material is silicon and the step of providing the substrate further comprises:

implanting oxygen to a first depth into a silicon wafer;

implanting oxygen to a second depth into said silicon wafer; and heating said wafer, said implanted oxygen forming said first and second SiO$_2$ layer within said wafer.

8. The method of claim 1, wherein the diffusion regions are formed by doping sidewalls of the second layer in the second openings.

9. The method of claim 8, wherein the conductive material disposed in the second openings is doped polysilicon and the sidewalls are doped by outdiffusion from the doped polysilicon.

10. A method of forming an FET comprising:

providing a substrate including at least first, second, and third layers of semiconductor material alternating with at least first and second dielectric layers;

forming a plurality of first trenches through the first layer of semiconductor material to the first dielectric layer;

forming in one or more of said plurality of first trenches, a second trench through the second layer of semiconductor material to the second dielectric layer;

forming a conformal dielectric layer on said substrate and along sidewalls of said trenches;

removing dielectric from the bottom of said first trenches and said second trenches until semiconductor is exposed therebelow;

etching exposed said semiconductor material to isolate channel sections between pairs of said first trenches;

forming diffusion regions of the FET in opposite ends of said channel sections; and disposing conductive material in the first trenches in electrical contact with the diffusion regions, upper gates being formed by said first semiconductor layer between said pairs of first trenches.

11. The method of claim 10 further comprising the step of:

forming contacts to a lower gate of the FET including disposing conductive material in the second trenches in electrical contact with the third layer of semiconductor material, the third layer of semiconductor material below the upper gates acting as the lower gate.

12. The method of claim 11 further comprising the steps of:

forming third trenches through the first, second, and third layers of semiconductor material and through the first and second dielectric layers down to a third dielectric layer; and disposing a isolation dielectric in the third trenches the isolation dielectric isolating the FET from an adjacent FET.

13. The method of claim 11, wherein the semiconductor material is silicon and the conductive material disposed in the first trenches is doped polysilicon.

14. The method of claim 13, wherein the step of providing the substrate comprises:

forming a SiO$_2$ layer on a plurality of silicon wafers; and bonding three or more said wafers together, a multilayered wafer being formed having two buried SiO$_2$ layers.

15. The method of claim 14, wherein the bonding step further comprises:

bonding an SiO$_2$ layer on a first silicon wafer to an SiO$_2$ layer on a second silicon wafer;

grinding a silicon surface of said second silicon wafer to a desired thickness;

oxidizing said ground surface;

bonding a third silicon wafer to said oxidized surface; and grinding a silicon surface of said third silicon wafer to a desired thickness.

16. The method of claim 13, wherein the step of providing the substrate further comprises:

implanting oxygen to a first depth into a silicon wafer;

implanting oxygen to a second depth into said silicon wafer; and heating said wafer, said implanted oxygen forming said first and second SiO$_2$ layer within said wafer.

17. The method of claim 13, wherein the diffusion regions are formed by doping sidewalls of the second layer in the first trenches.

18. The method of claim 17, wherein the conductive material disposed in the first trenches is doped polysilicon and the sidewalls are doped by outdiffusion from the doped polysilicon.

19. A method of forming an FET comprising:

providing a substrate including at least first, second, third and fourth layers of semiconductor material alternating with first, second and third dielectric layers;

forming a plurality of first trenches through the first layer of semiconductor material to the first dielectric layer;

forming in one or more of said plurality of first trenches, a second trench through the second layer of semiconductor material to the second dielectric layer, said second trenches being narrower than said first trenches;

filling said first trenches and each said second trench with dielectric material;

removing dielectric to form third trenches in said first trenches and each of said second trenches until semiconductor material is exposed in one of the semiconductor layers therebelow;

extending said third trenches by etching exposed said semiconductor material through said second semiconductor layer in said first trenches and through said third semiconductor layer in said second trenches, channel sections being defined in said second layer;

forming diffusion regions of the FET in opposite ends of said channel sections; and disposing conductive material in the third trenches, upper gates being formed by said first semiconductor layer between said pairs of first trenches.

20. The method of claim 19, wherein contacts are formed to a lower gate of the FET by conductive material disposed in the third trenches.

21. The method of claim 20, wherein the semiconductor material is silicon and the conductive material disposed in the third trenches is doped polysilicon.

22. The method of claim 21, wherein the step of providing the substrate comprises:

forming a SiO$_2$ layer on a plurality of silicon wafers; and bonding four or more said wafers together, a multilayered wafer being formed having two buried SiO$_2$ layers.

23. The method of claim 22, wherein the step of bonding further comprises:
- bonding a SiO$_2$ layer on a first silicon wafer to an SiO$_2$ layer on a second silicon wafer;
- grinding a silicon surface of said second silicon wafer to a desired thickness;
- oxidizing said ground surface;
- bonding a third silicon wafer to said oxidized surface;
- grinding a silicon surface of said third silicon wafer to a desired thickness;
- oxidizing said ground surface of said third wafer;
- bonding a fourth silicon wafer to said oxidized surface; and
- grinding a silicon surface of said fourth silicon wafer to a desired thickness.

24. The method of claim 21, wherein the step of providing the substrate further comprises:
- implanting oxygen to a first depth into a silicon wafer;
- implanting oxygen to a second depth into a silicon wafer;
- implanting oxygen to a third depth into a silicon wafer; and
- heating said wafer, said implanted oxygen forming said first, second and third SiO$_2$ layers within said wafer.

25. The method of claim 22, wherein the diffusion regions are formed by doping sidewalls of the second layer.

26. The method of claim 25, wherein the conductive material disposed in the first trenches is doped polysilicon and the sidewalls are doped by outdiffusion from the doped polysilicon.

* * * * *